United States Patent
Schlereth

(10) Patent No.: US 11,934,182 B2
(45) Date of Patent: Mar. 19, 2024

(54) METHOD FOR COMPUTER-SUPPORTED SIMULATION OF OPERATION OF A MACHINE WORKING IN AN AUTOMATED MANNER

(71) Applicant: Siemens Aktiengesellschaft, Munich (DE)

(72) Inventor: Michael Schlereth, Wilhermsdorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/980,797

(22) PCT Filed: Mar. 7, 2019

(86) PCT No.: PCT/EP2019/055682
§ 371 (c)(1),
(2) Date: Sep. 14, 2020

(87) PCT Pub. No.: WO2019/175011
PCT Pub. Date: Sep. 19, 2019

(65) Prior Publication Data
US 2020/0409346 A1    Dec. 31, 2020

(30) Foreign Application Priority Data
Mar. 15, 2018  (EP) .................... 18161933

(51) Int. Cl.
*G06F 30/20*  (2020.01)
*G05B 19/418*  (2006.01)

(52) U.S. Cl.
CPC ... *G05B 19/41885* (2013.01); *G05B 19/4183* (2013.01); *G05B 19/41865* (2013.01); *G06F 30/20* (2020.01); *G05B 2219/13174* (2013.01)

(58) Field of Classification Search
CPC .......... G05B 19/41885; G05B 19/4183; G05B 19/41865; G05B 2219/13174;
(Continued)

(56) References Cited

U.S. PATENT DOCUMENTS

2005/0102054 A1*  5/2005  Dolansky ........... G05B 19/4069
                                                                   700/182
2009/0254312 A1* 10/2009  Kube ..................... G06F 11/273
                                                                   702/186
(Continued)

FOREIGN PATENT DOCUMENTS

| EP | 2985663 | 2/2016 | |
|---|---|---|---|
| JP | 2001-282237 | 10/2001 | |
| JP | 2001282327 | * 10/2001 | ............. G05B 19/05 |

OTHER PUBLICATIONS

Merriam-Webster Dictionary, Definition of instantaneous, Jun. 2, 2022, retrieved from the internet URL :<https://www.merriam-webster.com/dictionary/instantaneous> (Year: 2022).*
E. A. Lee and S. A. Seshia, Introduction to Embedded Systems—A Cyber-Physical Systems Approach, Second Edition, MIT Press, 2017, URL :< https://ptolemy.berkeley.edu/books/leeseshia//releases/LeeSeshia_DigitalV2_2.pdf> (Year : 2017).*
(Continued)

*Primary Examiner* — Eric J Yoon
*Assistant Examiner* — Jonathan Michael Skrzycki
(74) *Attorney, Agent, or Firm* — Cozen O'Connor

(57) ABSTRACT

A method for computer-supported simulation of operation of a machine working in an automated manner, the machine being controllable during real operation via software on a programmable logic controller, wherein simulated control of the machine via software on a simulation computer is performed based on a predefined execution pattern, where the temporal execution sequence of processes executed by the software code and starting time points of processes are (Continued)

defined based on a virtual time and the execution time point of each process is set to zero in the virtual time in the predefined execution pattern, and during the simulation, the next process, which follows an ended process according to the execution sequence, is not started until a process in the real time of the simulation computer has ended, and where the virtual time is set to the starting time point of this next process when the next process is started.

10 Claims, 3 Drawing Sheets

(58) Field of Classification Search
CPC .......... G05B 2219/13185; G05B 2219/23445; G05B 19/4069; G06F 30/20
See application file for complete search history.

(56) References Cited

U.S. PATENT DOCUMENTS

| | | | |
|---|---|---|---|
| 2012/0310620 A1* | 12/2012 | Resmerita | G06F 9/4843 703/17 |
| 2013/0191106 A1* | 7/2013 | Kephart | G06F 30/20 703/21 |
| 2020/0409346 A1 | 12/2020 | Schlereth | |

OTHER PUBLICATIONS

PCT International Search Report and Written Opinion of International Searching Authority dated Jul. 6, 2019 corresponding to PCT International Application No. PCT/EP2019/055682 filed Jul. 3, 201.
Shankar, A. Udaya. "Discrete-Event Simulation", pp. 1-14, Jan. 1991.

* cited by examiner

METHOD FOR COMPUTER-SUPPORTED SIMULATION OF OPERATION OF A MACHINE WORKING IN AN AUTOMATED MANNER

CROSS-REFERENCE TO RELATED APPLICATIONS

This is a U.S. national stage of application No. PCT/EP2019/055682 filed 7 Mar. 2019. Priority is claimed on European Application No. 18161933.9 filed 15 Mar. 2018, the content of which is incorporated herein by reference in its entirety.

BACKGROUND OF THE INVENTION

1. Field of the Invention

The invention relates to a simulation computer, a computer program product, a computer program and to a method for computer-aided simulation of the operation of a machine working in an automated manner.

2. Description of the Related Art

In industrial automation systems, programmable logic controllers, which are also referred to as PLCs, are used to operate machines working in an automated manner. The PLCs store a respective software code that controls the operation of a corresponding machine. In this case, various program modules of the software code are executed and perform predefined tasks of the machine. The program modules are generally repeated cyclically and may take on various functions. By way of example, one program module may control a machine drive, and another program module may perform path planning for the movement of the machine. Priorities are generally defined for the program modules, such that a program module having a higher priority is executed with preference over program modules having a lower priority.

Software code for programmable logic controllers is generally developed in order, for example, to implement new functions in the software code. There is therefore the requirement to test the software code on a simulation computer before it is actually used in the corresponding programmable logic controller, i.e., to simulate the operation of the machine controlled by way of the programmable logic controller with the corresponding software code. Such a simulation may be used to detect in advance programming errors that would lead to incorrect behavior of the machine during real operation.

When simulating the operation of a machine via a simulation computer, there is the problem that the computing speed of the processor of the simulation computer generally differs significantly from the computing speed of the CPU of a programmable logic controller. This may lead to the execution order of the program modules on the simulation computer differing from the execution order on a real programmable logic controller, such that the simulation delivers results different from the real programmable logic controller.

In order to avoid this problem, the prior art discloses approaches in which the time consumed by respective instructions of the software code on a real programmable logic controller is estimated and the execution time of the corresponding instructions on the simulation computer is adjusted thereto. This procedure is complex because a large number of instructions must be analyzed in terms of their duration. This approach furthermore extends the simulation time on the simulation computer.

SUMMARY OF THE INVENTION

In view of the foregoing, it is therefore an object of the invention to provide a method for computer-aided simulation of the operation of a machine working in an automated manner, via which method the real operation of the machine can be simulated easily and quickly via a simulation computer.

This and other objects and advantages are achieved in accordance with the invention by a simulation computer and method, where the method in accordance with the invention is used for the computer-aided simulation of the operation of a machine working in an automated manner, which machine can be controlled during real operation via software code on a programmable logic controller. The term "machine working in an automated manner" should be understood in the broad sense. Such a machine may particularly also have a plurality of components, and in this sense constitute a technical system. The machine may, in this case, be intended to automatically perform any desired processes. The machine may in particular be a machine tool. A machine tool should be understood to mean a machine that machines a workpiece, such as a lathe or a milling machine. The machine working in an automated manner may likewise be a production machine, such as a packaging machine. The machine may furthermore also be a logistics system or part of a logistics system, such as a high-bay warehouse operated in an automated manner.

In the course of the method in accordance with the invention, simulated control of the machine is performed via the software code on a simulation computer. In other words, the software code is executed not on a programmable logic controller, but rather on a simulation computer, i.e., a corresponding CPU of this computer, in the course of the simulation. The simulated control is, in this case, based on a predefined execution pattern. The predefined execution pattern defines the temporal execution order of processes executed by the software code based on a virtual time. The starting times of these processes are likewise specified based on the virtual time. The execution time of each process in the virtual time is furthermore set to zero. An execution pattern that corresponds to the real operation is thus predefined in a virtual time that corresponds to the time in the simulated real operation.

Setting the execution time of the respective processes to zero achieves a situation whereby the execution pattern is executed deterministically and not based on priorities of processes, since each process in the virtual time is instantaneous following the start thereof until the end, such that there are not able to be any process interruptions due to other processes having higher priorities.

In accordance with the invention, in the course of the simulated control of the machine, the next process, which follows a process in the execution order that has ended, is started only after the end of the process in the real time of the simulation computer, where the virtual time is set to the starting time of the next process at the start of this next process. This feature ensures that the actual process execution follows the simulated process execution according to the real time of the simulation computer and the virtual time is accordingly readjusted, even though the execution times of the respective processes in the virtual time are set to zero. As a result of the simulation, outputs are obtained that were generated in the course of the simulation by executing the software code. Corresponding inputs that are brought about through the operation of the real machine (for example, machine positions) are in this case simulated. The outputs obtained through the simulation may then be evaluated to determine whether the simulated operation of the machine corresponds to a desired behavior.

The method in accordance with the invention has the advantage that a certain execution pattern of processes can be mapped in a simulation computer. This is achieved by setting the execution times of the processes to zero in a virtual time and by readjusting the virtual time at the end of a corresponding process on the simulation computer. In this case, the simulation may be performed at the full speed of the simulation computer. It is furthermore not necessary to estimate the execution times of corresponding instructions on the programmable logic controller, as is the case in the prior art.

In one preferred embodiment of the method in accordance with the invention, the predefined execution pattern is based on a real process execution, in which processes were executed by a real machine working in an automated manner via software code on a real programmable logic controller, where the temporal execution order of the processes and their starting times in the real process execution correspond to the execution order and the starting times of the processes in the predefined execution pattern. In other words, the predefined execution pattern differs from the real process execution because the execution times of the individual processes are set to zero, which is not the case in the real process execution.

In one variant of the embodiment that has just been described, the predefined execution pattern is calculated from a digital specification of the real process execution in the course of the method in accordance with the invention. It is likewise possible for a predefined execution pattern based on the real process execution to already be present in digital form at the beginning of the method according to the invention and to be read in in the course of the method.

In another embodiment of the invention, the software code that was used in the real process execution corresponds to the software code running on the simulation computer. The software code on the simulation computer may nevertheless also exhibit differences from the software code of the real process execution. By way of example, the software code on the simulation computer may be a development of the software code of the real process execution, where the aim of the method in accordance with the invention is to test the developed software code in the course of a simulation. Such tests are usually referred to as regression tests.

In a further embodiment of the method in accordance with the invention, a task executed by a program module of the software code and that is interrupted one or more times by another program module is represented in the predefined execution pattern such that the execution sections of the task that are situated next to the interruptions are represented by separate processes having the starting time of the beginning of the execution section and an execution time of zero. The prioritization of tasks in the course of the disclosed embodiments of the method in accordance with the invention can thereby also be simulated deterministically.

Depending on the intended use of the disclosed embodiments of the method in accordance with the invention, the predefined execution pattern may represent a predefined fault case during operation of a machine working in an automated manner and/or control of a machine working in an automated manner using a programmable logic controller having a predefined computational power. Different fault scenarios or different types of programmable logic controllers are thereby able to be taken into consideration in the simulation.

In a further embodiment of the method in accordance with the invention, before the processes are executed on the simulation computer in the predefined execution pattern, a check is performed to determine whether the predefined execution pattern can actually be executed on a machine that is really working, where a fault state is generated if the predefined execution pattern cannot be executed on a machine that is really working. Depending on the refinement, the generated fault state may have different consequences. A corresponding fault may possibly just be stored digitally and read later in the course of checking the simulation. It is likewise possible for a warning message to be output via a user interface when a fault state is generated. A user is thereby alerted to the fact that the simulation cannot actually be implemented in reality in the predefined execution pattern. Corresponding checks as to whether the predefined execution pattern can actually be executed are within the ability of a person skilled in the art. By way of example, the predefined execution pattern cannot be executed when a determined priority order of the executed program modules is not complied with thereby.

In addition to the method described above, it is also an object of the invention to provide a simulation computer for computer-aided simulation of the operation of a machine working in an automated manner, where the machine is controllable during real operation via software code on a programmable logic controller, and where the simulation computer is configured so as to perform the method in accordance with the invention or at least one preferred embodiments of the method in accordance with the invention.

It is also an object of the invention furthermore to provide a computer program product, i.e., non-transitory computer-readable medium, containing a program code stored on a machine-readable carrier for performing the method in accordance with the invention or at least one or more preferred embodiments of the method in accordance with the invention when the program code is executed on a computer that corresponds to the above-described simulation computer.

It is also asn object of the invention to provide a computer program containing a program code for performing the method in accordance with the invention or at least one preferred embodiment of the method in accordance with the invention when the program code is executed on a computer that corresponds to the above-described simulation computer.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Exemplary embodiments of the invention are described in detail below with reference to the appended figures, in which.

DETAILED DESCRIPTION OF THE EXEMPLARY EMBODIMENTS

A description is given below of one embodiment of the method in accordance with the invention via which the operation of a machine working in an automated manner, such as a machine tool or a production machine, is simulated for two programmable logic controllers having different computational powers. Execution patterns, which are based in the embodiment described here on the respective process executions EX1 and EX2 in FIG. 1 that were recorded for a real machine, are used as a basis for the simulation.

The process execution EX1 relates to the performance of processes in a machine M working in an automated manner with a programmable logic controller CO having a high processor power and thus fast computing time, whereas the process execution EX2 was performed with a programmable logic controller CO having a lower processor power and thus lower computing speed. Both programmable logic controllers use the same software code COD', where different process executions EX1 and EX2 are, however, obtained due to the different computational powers of the programmable logic controllers.

Figure 1:
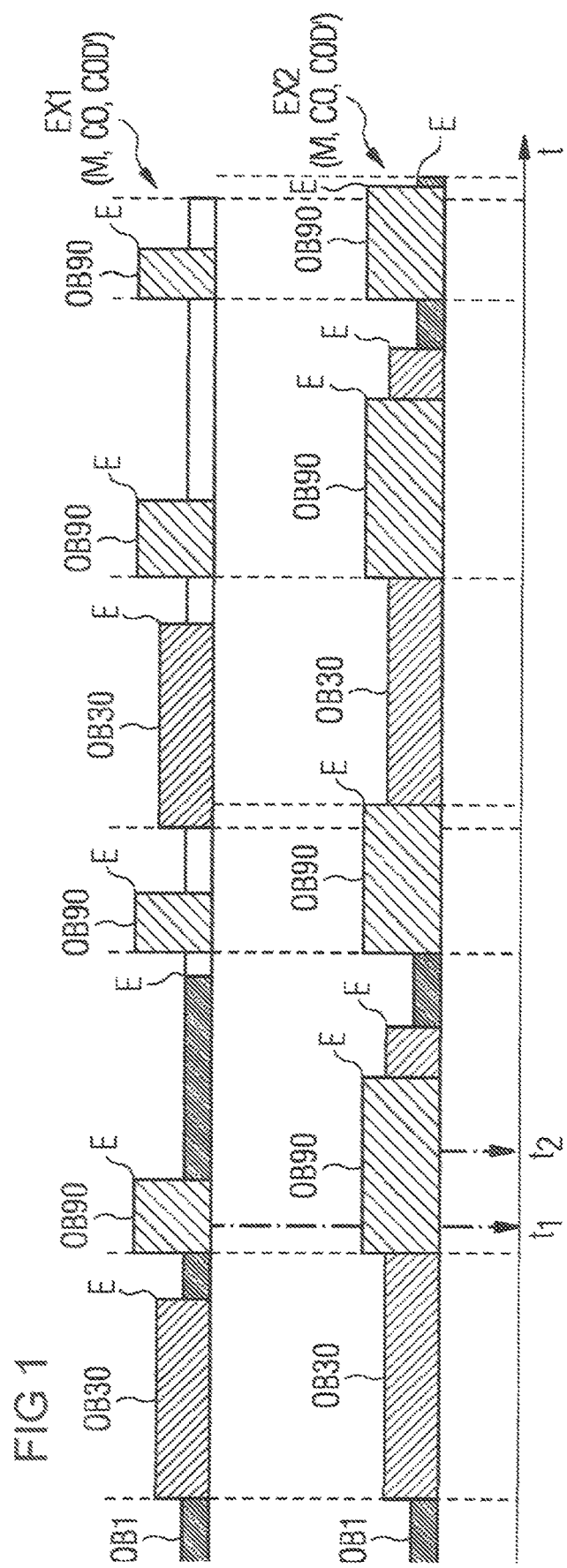
FIG. 1 shows a timing diagram that depicts the execution of processes in a real machine working in an automated manner based on different programmable logic controllers having different computational powers according to the same software code on the controllers in accordance with the invention.

With reference to the diagram in FIG. 1, the real time of the two process executions EX1 and EX2 is indicated along the abscissa. The bars depicted in FIG. 1 having the different pattern fill levels indicate the execution of program modules of the software code COD' by respective programmable logic controllers CO. Bars having the same pattern fill level, in this case, relate to the same program module. The reference signs OB1, OB30 and OB90 are used to denote the program modules. White bars in FIG. 1 represent time intervals in which no program module is executed. The reference sign E furthermore indicates the end times of the execution of the corresponding program modules. In other words, transitions between different bars that are not provided with the reference sign E do not represent the end of the program module situated to the left of the transition, but rather this indicates an interruption of this program module.

The height of the bars represents the priority of the program modules when they are executed. In other words, the higher the bar, the higher the priority of the corresponding program module. In the scenario in FIG. 1, the program module OB1 thus has the lowest priority, which means that the program modules OB30 and OB90 pending execution interrupt a program module OB1 that is currently being executed. By contrast, the program module OB30 has medium priority, i.e., this program module is interrupted only by the program module OB90. The program module OB90 has the highest priority, i.e., pending execution of this program module always leads to the other two program modules OB1 and OB30 being interrupted.

In accordance with the process execution EX1 of the faster programmable logic controller, the process OB1 is interrupted once by the process OB30 and once more by the process OB90. By contrast, the process OB30 is not interrupted once by the process OB90. In contrast thereto, in the process execution EX2 of the slower programmable logic controller, both the left-hand program module OB30 and the right-hand program module OB30, which is later in time, is interrupted once by a corresponding program module OB90. There are also a relatively large number of interruptions to the program module OB1. The relatively high number of interruptions results from the higher computing time for the execution of the individual program modules, such that interruptions due to higher-priority program modules occur more often.

In the presently described embodiment of the method in accordance with the invention, an execution pattern is used to simulate the operation of the machine M both based on the fast programmable logic controller corresponding to the process execution EX1 and based on the slower programmable logic controller corresponding to the process execution EX2.

The execution pattern, which is referred to by SP (SP=Sequence Pattern) in FIG. 2 described further below, depicts the program modules represented in the respective process executions EX1 and EX2 in the form of processes. A process, in this case, corresponds to the continuous execution of the respective program module until its end or until it is interrupted. In other words, a program module that is interrupted one or more times by other program modules consists of a plurality of processes that represent the respective subsections of the program module that are temporally adjacent to the program modules that cause the interruption. If a program module is not interrupted, this program module corresponds to an individual process of the execution pattern. The execution pattern furthermore stores the starting times of the respective processes.

The execution pattern may have been calculated in advance and read from its memory. It is likewise possible for the execution pattern to be calculated via the corresponding processes and their starting times in the course of the simulation method from the respective process executions in FIG. 1.

FIG. 1 furthermore indicates two times t1 and t2 through dot-and-dash arrows. The time t1 represents the command to read in the current time by the program module OB90 of the process execution EX1. This command is also performed in the corresponding program module OB90 of the process execution EX2, but at the later time t2 that results from the slower process execution. The method described here is based on the assumption that the difference between such times within a respective program module is irrelevant to the further process execution, such that the starting time of the corresponding program module may also be used for these times.

Figure 2:
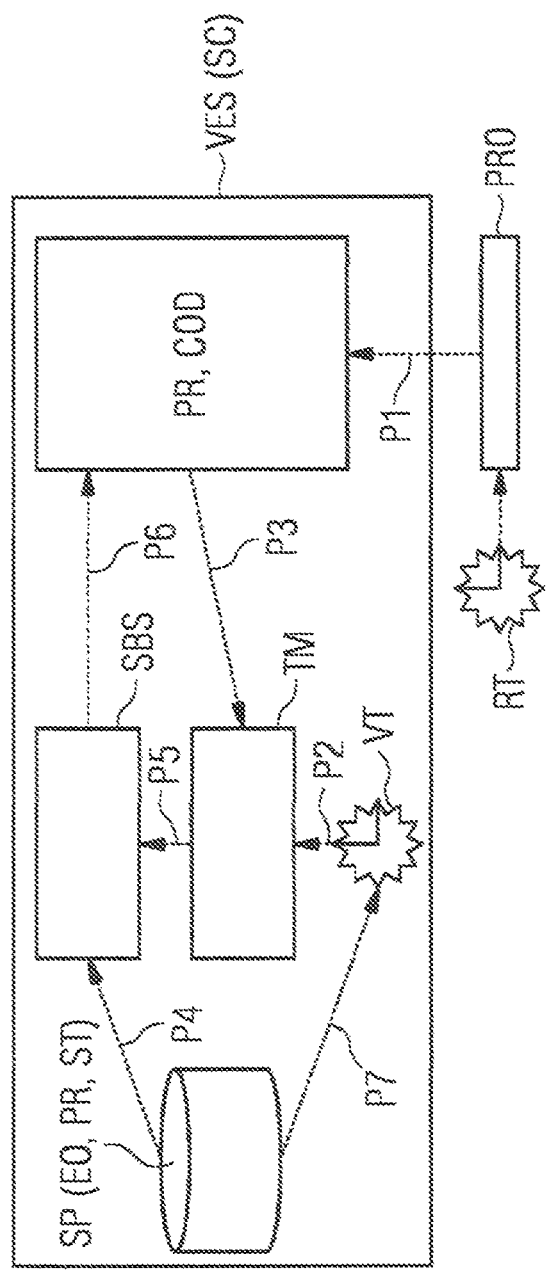
FIG. 2 shows a schematic illustration that illustrates the essential components of a simulation computer that is used in one embodiment of the invention to simulate the operation of a machine working in an automated manner in accordance with the invention.

FIG. 2 illustrates a virtual execution system VES (VES) for a programmable logic controller that is part of a simulation computer SC. In addition to the execution system, the simulation computer contains a CPU or a processor, which is referred to in FIG. 2 by PRO. A software code COD is executed via the processor. This software code represents a development of the corresponding software code COD' from FIG. 1. It is then intended to be determined in the course of a regression test through simulation whether the developed software code COD would lead to a fault in the machine operation when it is used in a real programmable logic controller. To this end, the software code COD is executed on the computer SC by the processor PRO, this being indicated by the arrow P1 and the right-hand rectangle within the virtual execution system VES. The processor PRO in this case works with the real time RT.

The execution pattern SP is used to test the software code COD, wherein this pattern, depending on the test that is executed, is based on the process execution EX1 for the faster programmable logic controller or on the process execution EX2 for the slower programmable logic controller. The execution pattern SP contains the execution order of the above-described processes, corresponding to the process execution EX1 or EX2. This execution order is denoted by EO (EO) in FIG. 2, whereas the processes are denoted by PR. The corresponding starting times of the respective processes PR are furthermore denoted by ST.

The virtual execution system VES uses a virtual time VT, via which the time of the process execution on the respective programmable logic controller is represented, for the execution pattern SP. In other words, the starting times ST in the execution pattern SP are indicated in the virtual time VT. One aspect that is essential to the invention is then that the execution time for a respective process PR is set to zero. This thus ensures that the execution order EO is complied with and that there are not able to be any interruptions in the execution of processes, since the respective execution of a process is instantaneously ended.

The virtual execution system VES furthermore contains a time management unit TM that is based on the virtual time VT, as indicated by the arrow P2. This time management unit executes inter alia time-read commands at particular times in accordance with instructions from the software code COD, this being indicated by the arrow P3. Since the corresponding execution time of the processes is zero, the times t1 and t2 indicated in FIG. 1 are thereby mapped onto the corresponding virtual starting time of the program module OB90.

The virtual execution system VES in FIG. 2 furthermore contains a deterministic scheduler, which is denoted by the reference sign SBS (SBS=Sequence-based Scheduler). This scheduler processes the execution pattern SP, as indicated by the arrow P4. The scheduler is triggered based on the virtual time VT via the time management unit TM, as indicated by the arrow P5. The scheduler SBS starts the processes according to the program modules of the software code COD, as indicated by the arrow P6. In order to ensure that the virtual time VT is tracked following the execution of the respective processes, this time is readjusted based on the execution pattern SP, this being indicated by the arrow P7. This readjustment occurs such that the virtual time VT is reset only after the end of a corresponding process in the real time RT of the processor PRO, specifically at the starting time of the next process of the execution pattern SP.

As is apparent from the above description, the system in FIG. 2 easily achieves deterministic process execution for the simulated control of a machine based on a fast and a slow programmable logic controller. What is essential to the invention in this case is that the execution time of the processes in a virtual time is set to zero in order thereby to comply with the execution order, and that the virtual time is furthermore set to the starting time of a following process when the previous process is concluded in accordance with the real time of the simulation computer.

Figure 3:
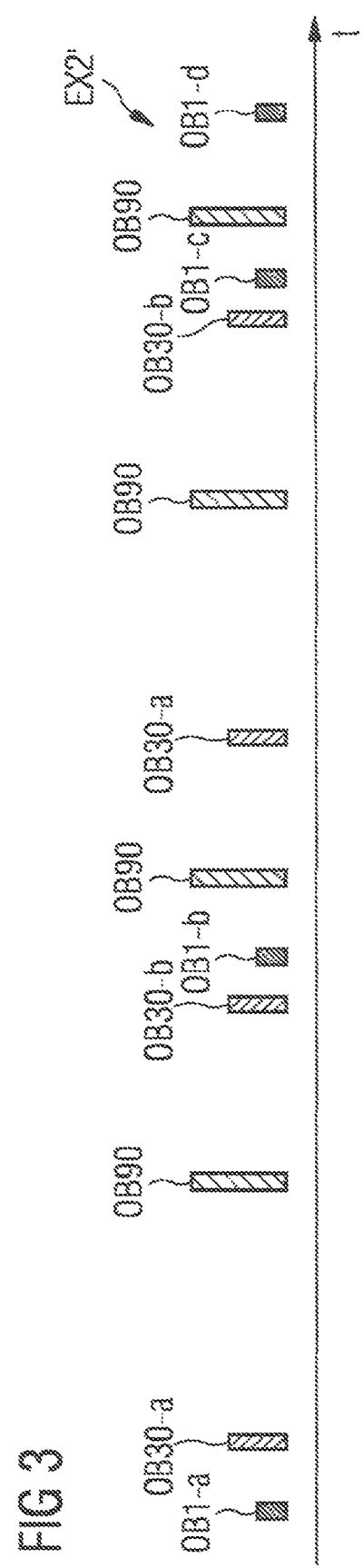
FIG. 3 shows a timing diagram that explains the execution of processes on the simulation computer in FIG. 2 based on a real process execution from FIG. 1.

FIG. 3 illustrates once again by way of example a process execution EX2' in the execution pattern SP in FIG. 2, specifically based on the process execution EX2 of a slow programmable logic controller. The abscissa in this case represents the virtual time. As is apparent from FIG. 3, a corresponding process exists in FIG. 3 for each continuous section of the bars from the process execution EX2 in FIG. 1, where the processes in FIG. 3 are depicted as narrow bars. If the process in FIG. 1 was not interrupted, then the bar in FIG. 3 corresponds to a program module. This is the case for the program modules OB90.

By contrast, corresponding separate processes in the process execution EX2' in FIG. 3 exist for subsections of program modules from FIG. 1 that result from interruptions. For the program module OB1, there are thus four processes OB1-a, OB1-b, OB1-c and OB1-d due to the interruptions thereof. The left-hand program module OB30 in FIG. 1 was furthermore interrupted by the program module OB90, giving rise to two processes OB30-a and OB30-b. There are accordingly also two processes OB30-a and OB30-b due to the interruption of the right-hand program module OB30.

Through the depiction of narrow bars, it is indicated in FIG. 3 that the program modules or the subsections thereof have an execution time of zero in the execution pattern SP. The positions of the bars in FIG. 3 thus correspond to the starting times of the respective processes.

The embodiment described above of the invention has a number of advantages. An execution time of zero can be defined for corresponding processes by using a virtual time in the course of simulating a machine operation. A deterministic time sequence of the process execution can thereby be achieved. Code interruptions furthermore can also be mapped by defining separate processes for corresponding subsections of program modules, and a priority-based behavior is thereby able to be simulated. The processor of the simulation computer may in this case work at full speed and is not delayed by the virtual time. By using a predefined sequence behavior based on a corresponding execution pattern, it is possible to take into consideration programmable logic controllers having different performance classes in the course of the simulation.

Figure 4:
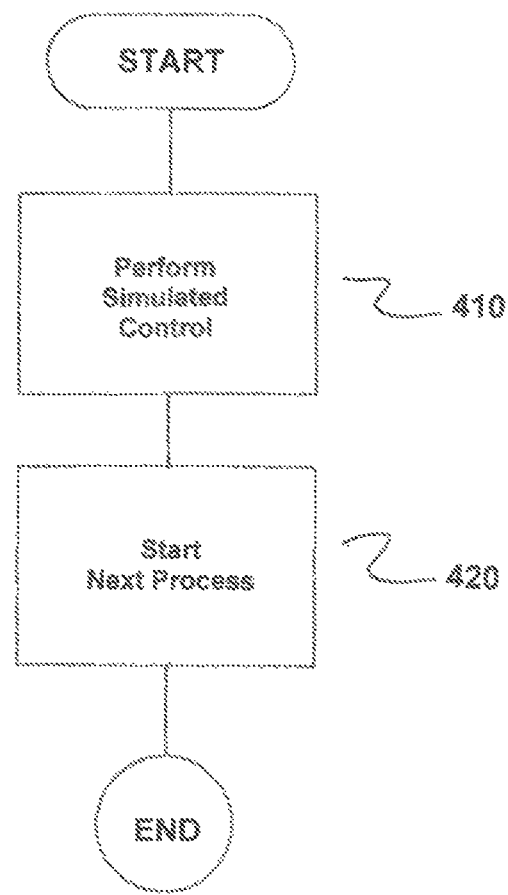
FIG. 4 is a flowchart of the method in accordance with the invention.

FIG. 4 is a flowchart of the method for computer-aided simulation of the operation of a machine M working in an automated manner, where the machine is controllable during real operation via software code COD on a programmable logic controller CO. The method comprises performing simulated control of the machine M via the software code COD on a simulation computer SC based on a predefined execution pattern SP, as indicated in step 410. In accordance with the method of the invention, the predefined execution pattern SP defines a temporal execution order EO of processes PR executed by the software code COD and starting times ST of processes PR based on a virtual time VT, and an execution time of each process PR in the virtual time VT is set to zero.

Next, during the simulated control of the machine, a next process PR, which follows an ended process PR in the temporal execution order EO, is started only after a process PR in the real time RT of the simulation computer SC has ended, as indicated in step 420. In accordance with the method of the invention, the virtual time VT is set to the starting time ST of the next process PR at the start of this next process PR.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention.

For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for computer-aided simulation of operation of a machine working in an automated manner, said machine being controllable during real operation via software code on a programmable logic controller, the method comprising:
   performing simulated control of the machine via the software code on a simulation computer based on a predefined execution pattern, said predefined execution pattern defining a temporal execution order of processes executed by the software code, starting times of the processes being based on a virtual time, an execution time comprising a duration of time of each process in the virtual time being set to zero such that process interruptions caused by other processes having higher priorities cannot occur and the temporal execution order of processes executed by the software code is maintained, and said predefined execution pattern corresponding to the real operation of the machine; and
   starting, during the simulated control of the machine, a next process, which follows an ended process in the temporal execution order, only after a process in a real time of the simulation computer has ended, the virtual time being set to the starting time of the next process at the start of this next process.

2. The method as claimed in claim 1, wherein the predefined execution pattern is based on a real process execution, in which processes were executed by a real machine working in an automated manner via software code on a real programmable logic controller; and
   wherein the temporal execution order of the processes and associated starting times in the real process execution correspond to the execution order and the starting times of the processes in the predefined execution pattern.

3. The method as claimed in claim 1, wherein a task executed by a program module of the software code and which is interrupted one or more times by another program module is represented in the predefined execution pattern such that execution sections of the task situated next to interruptions are represented by separate processes having the starting time of the beginning of the execution section and a simulated execution time of zero.

4. The method as claimed in claim 2, wherein a task executed by a program module of the software code and which is interrupted one or more times by another program module is represented in the predefined execution pattern such that execution sections of the task situated next to interruptions are represented by separate processes having the starting time of the beginning of the execution section and a simulated execution time of zero.

5. The method as claimed in claim 1, wherein the predefined execution pattern represents a predefined fault case during at least one of (i) operation of the machine working in an automated manner and (ii) control of the machine working in an automated manner utilizing a programmable logic controller having a predefined computational power.

6. The method as claimed in claim 1, wherein before the processes are executed on the simulation computer in the predefined execution pattern, the method further comprising:
   checking whether the predefined execution pattern can be executed on a machine that is really working; and
   generating a fault state if the predefined execution pattern cannot be executed on the machine that is really working.

7. The method as claimed in claim 1, wherein the operation of the machine working in the automated manner as one of (i) a machine tool, (ii) a production machine and (iii) at least part of a logistics system is simulated.

8. A simulation computer for computer-aided simulation of operation of a machine working in an automated manner, said machine being controllable during real operation via software code on a programmable logic controller, the simulation computer being configured to perform a method in which:
   simulated control of the machine is performed via the software code on the simulation computer based on a predefined execution pattern of processes, the predefined execution pattern defining a temporal execution order of processes executed by the software code, starting times of the processes being based on a virtual time, an execution time comprising a duration of time of each process in the virtual time being set to zero such that process interruptions caused by other processes having higher priorities cannot occur and the temporal execution order of processes executed by the software code is maintained, and said predefined execution pattern corresponding to the real operation of the machine;
   wherein, during the simulated control of the machine, a next process, which follows a process in the execution order which has ended, is started only after the process in a real time of the simulation computer has ended; and
   wherein the virtual time is set to a starting time of the next process at a start of said next process.

9. The simulation computer as claimed in claim 8, wherein the predefined execution pattern is based on a real process execution, in which processes were executed by a real machine working in an automated manner via software code on a real programmable logic controller; wherein the temporal execution order of the processes and associated starting times in the real process execution correspond to the execution order and the starting times of the processes in the predefined execution pattern.

10. A non-transitory computer-readable medium program product encoded with a computer program including program code stored on a machine-readable carrier which, when executed on a computer which corresponds to a simulation computer, causes computer-aided simulation of the operation of a machine working in an automated manner, the computer program comprising:
   program code for performing simulated control of the machine via the software code on a simulation computer based on a predefined execution pattern, said predefined execution pattern defining a temporal execution order of processes executed by the software code, starting times of the processes being based on a virtual time, an execution time comprising a duration of time of each process in the virtual time being set to zero process interruptions caused by other processes having higher priorities cannot occur and the temporal execution order of processes executed by the software code is maintained, and said predefined execution pattern corresponding to the real operation of the machine; and program code for starting, during the simulated control of the machine, a next process, which follows an ended process in the temporal execution order, only after a process in a real time of the simulation computer has ended, the virtual time being set to the starting time of the next process at the start of this next process.

\* \* \* \* \*